United States Patent [19]

Wais et al.

[11] Patent Number: 4,779,948
[45] Date of Patent: Oct. 25, 1988

[54] CONTACT WITH EXCHANGEABLE OPTO-ELECTRONIC ELEMENT

[75] Inventors: Thomas Wais, Neckarsulm; Werner G. Schrott, Heilbronn, both of Fed. Rep. of Germany

[73] Assignee: Amphenol Corporation, Wallingford, Conn.

[21] Appl. No.: 859,574

[22] Filed: May 5, 1986

[30] Foreign Application Priority Data

May 14, 1985 [DE] Fed. Rep. of Germany ....... 3517389

[51] Int. Cl.$^4$ .............................. G02B 6/36; H01J 5/16
[52] U.S. Cl. .............................. 350/96.20; 350/96.10; 250/227; 439/59; 439/79; 439/499; 439/546; 439/551
[58] Field of Search ............... 350/96.20, 96.10, 96.21, 350/96.22; 250/227; 439/53, 55, 59, 492, 499, 546, 551, 801, 815, 78, 79

[56] References Cited

U.S. PATENT DOCUMENTS

| | | | |
|---|---|---|---|
| 3,792,284 | 2/1974 | Kaelin | 250/227 X |
| 3,809,908 | 5/1974 | Clanton | 350/96.20 X |
| 3,878,397 | 4/1975 | Robb et al. | 350/96.20 X |
| 4,217,030 | 8/1980 | Howarth | 350/96.21 |
| 4,233,724 | 11/1980 | Bowen et al. | 350/96.21 |
| 4,294,512 | 10/1981 | Logan | 350/96.20 |
| 4,330,172 | 5/1982 | Monaghan et al. | 350/96.21 |
| 4,479,696 | 10/1984 | Lubin et al. | 350/96.20 |
| 4,597,631 | 7/1986 | Flores | 350/96.20 |
| 4,678,264 | 7/1987 | Bowen et al. | 350/96.20 |
| 4,733,934 | 3/1988 | Wais et al. | 350/96.20 |
| 4,747,656 | 5/1988 | Miyahara et al. | 350/96.20 |

FOREIGN PATENT DOCUMENTS

| | | | |
|---|---|---|---|
| 0062287 | 12/1982 | European Pat. Off. | 350/96.20 |
| 2741585 | 9/1977 | Fed. Rep. of Germany | 350/96.20 |
| 3112078 | 10/1982 | Fed. Rep. of Germany | 350/96.20 |
| 2044949 | 10/1980 | United Kingdom | 350/96.20 |
| 2106662 | 4/1983 | United Kingdom | 350/96.20 |

OTHER PUBLICATIONS

Patent Abstracts of Japan—Japanese Patent Application 54-104,356, *Siemens Components*, vol. 20, No. 2, Apr. 1985, pp. 68-71.
32nd Electronic Components Conference, IEEE, May 10-12, 1982, pp. 124-127.
IBM Technical Disclosure Bulletin, vol. 22, No. 9, Feb. 1980, pp. 3975-3976.

*Primary Examiner*—William L. Sikes
*Assistant Examiner*—Brian M. Healy
*Attorney, Agent, or Firm*—Bacon & Thomas

[57] ABSTRACT

Active special contact, adapted for insertion into a hybrid contact insert of a connector, the active contact including a housing, first contact elements disposed in the housing, a supporting element for receiving an electro-optic transducer, second contact elements disposed in the supporting element, means for the detachable connection of the housing and the supporting element, and means for releasably connecting the first and second contact elements.

19 Claims, 2 Drawing Sheets

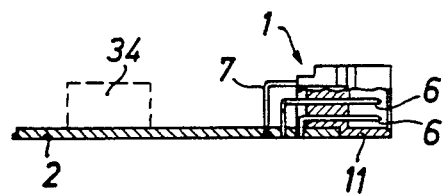
Fig.1
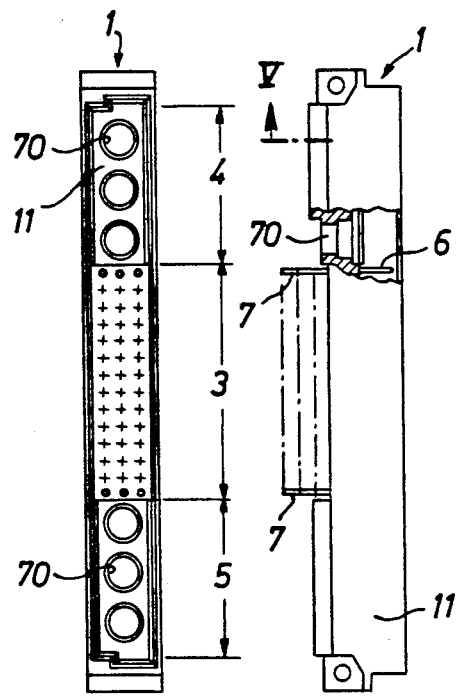
Fig.2  Fig.3
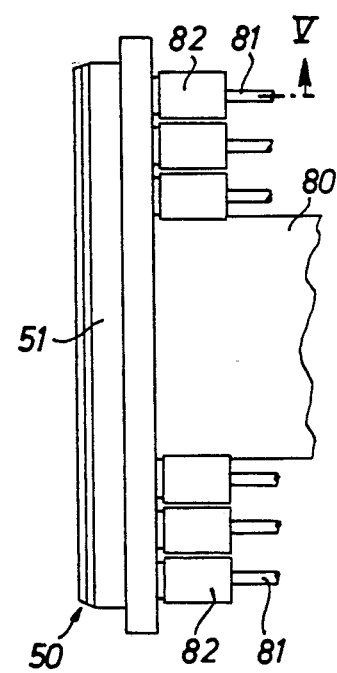
Fig.4
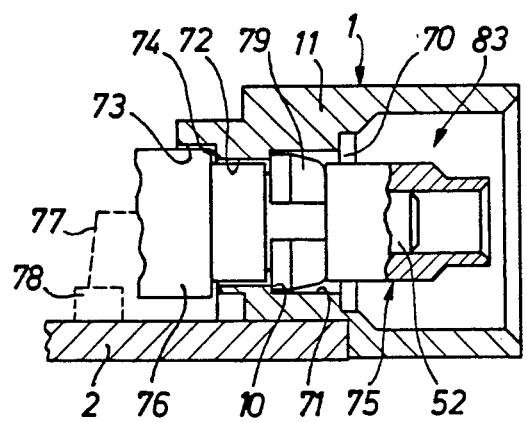
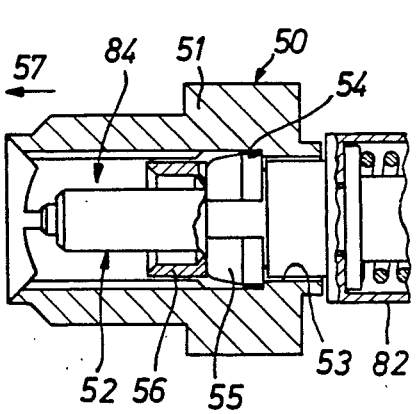
Fig.5

4,779,948

CONTACT WITH EXCHANGEABLE OPTO-ELECTRONIC ELEMENT

BACKGROUND OF THE INVENTION

1. Field of the Invention

This invention relates to an active special contact, in particular for insertion into hybrid connectors.

2. Description of the Prior Art

So-called special contacts for strip-shaped plug connectors are already known. Strip-shaped or elongated plug connectors are generally formed by a blade strip and a spring strip. These strips or contact inserts may include holes to seat the special contacts in the spring and blade strips. Hybrid connectors generally have a contact insert in which signal contacts are included together with contacts for power, coax or optical fibers.

Of course, there are again two kinds of hybrid contact inserts interacting with each other, namely a blade insert strip and a spring insert strip. When using such a hybrid contact insert, e.g. a blade insert strip, in conjunction with a printed circuit board, the connecting arms of the contact blades are soldered into the circuit board (or any other component). If, for example, an optical special contact is inserted in the blade insert strip, it communicates with an opto-electronic component e.g. on the circuit board via a light waveguide. The light waveguide terminates in the special contact. When introducing the associated spring insert strip into the blade strip, a light waveguide present in the spring strip needs to be brought into alignment with the light waveguide of the blade strip, thus establishing a connection.

It would be desirable to provide a special contact which alleviates the above problems.

SUMMARY OF THE INVENTION

In accordance with this invention, there is provided an active special contact adapted for insertion into a hybrid contact insert of a connector, the active contact comprising a housing, first contact elements disposed in the housing, a supporting element for receiving an electro-optic transducer, second contact elements provided in the supporting element, means for releasably connecting the housing and the supporting element, and means for releasably connecting the first and second contact elements.

To avoid the disadvantages occurring in the state of the art the invention provides a special contact in which an electro-optic transducer is housed. The electro-optic transducer may be a diode (transmitter), for instance, or also a receiver. In general, such a special contact can be called an active special contact as it contains an active electro-optic device.

Due to the fact that the opto-electronic transducer is installed in the active special contact and the special contact is located in a chamber or hole of the hybrid contact insert, a fiber to fiber coupling, i.e. the coupling of two light waveguides, can now be avoided. Furthermore, the solution according to the invention saves space on the chassis or circuit board connected to the contact insert because, after all, the opto-electric transducer does not have to be accommodated on the chassis. The design according to the invention is also inexpensive and, considering the electro-optic elements or transducers used, completely uncritical regarding offset of the light wave-guide in axial and radial directions and regarding angular offset.

One main advantage of the invention is that the transducer together with its holding means can be removed and replaced when needed (e.g. because the electro-optic transducer is defective). This is also possible without difficulty when a hybrid contact insert soldered into the chassis is involved.

According to one preferred embodiment of the invention, the electro-optic transducer is retained in a metal sleeve crimped to the housing rim of the electro-optic transducer, resulting in a good heat transfer from the heat generating electro-optic transducer to the sleeve so that a greater power loss in the transducer becomes possible. Another advantage of the metal sleeve is its shielding effect. Furthermore, the housing accommodating the holding element for the transducer is preferably made of metal, resulting in a completely shielded connection.

BRIEF DESCRIPTION OF THE DRAWINGS

FIG. 1 shows a transverse section of a blade hybrid contact insert mounted on a circuit board.

FIG. 2 is a rear view (from the left in FIG. 3) of a hybrid contact insert.

FIG. 3 is a side view of the contact insert of FIG. 2.

FIG. 4 is a side view of a spring hybrid contact insert suited for connecting to the blade insert of FIG. 3.

FIG. 5 is a section in larger scale along line 5—5 in FIGS. 3 and 4.

DESCRIPTION OF THE PREFERRED EMBODIMENTS

Figure 6:
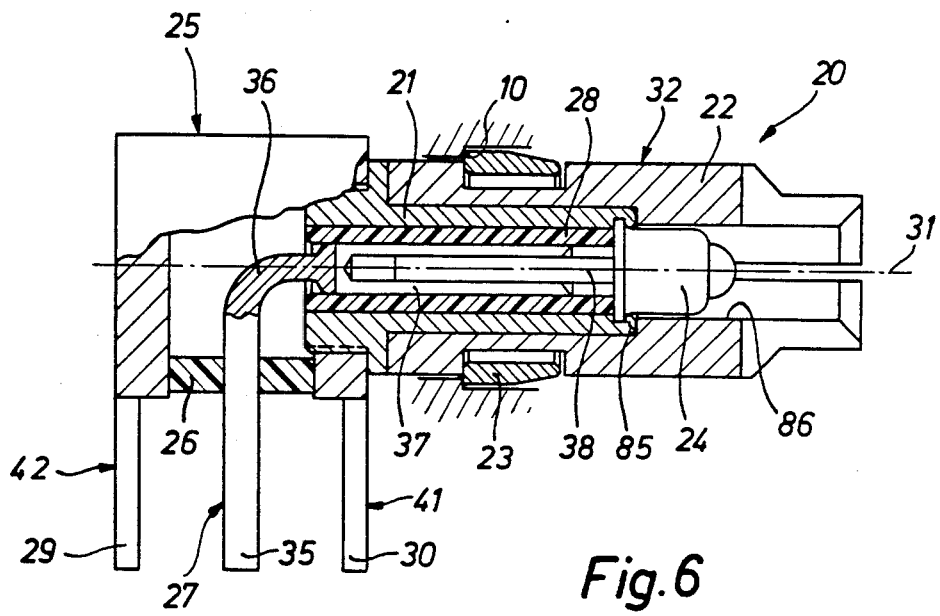
FIG. 6 is a longitudinal section of an active contact designed in accordance with the invention.

First, a hybrid contact insert, namely a blade contact insert 1 and a spring contact insert 50, will be described quite generally, with reference to FIGS. 1 through 5. Thereafter, an embodiment example of the invention will be discussed with reference to FIGS. 6 and 7.

The present invention relates in particular to opto-electronic technology. In particular, the term electro-optic transducer or the term electro-optic element is used herein. However, for the sake of simplicity merely the term transducer is used also, which may be either an electro-optic transducer (diode) or an opto-electronic transducer. The first mentioned transducer may be called a transmitter and the second one a receiver.

FIG. 1 and also FIG. 5 show the attachment of an elongated blade contact insert 1 of a connector to a circuit board or chassis 2. The connector shown is of the German standard DIN No. 41612, although, of course, this invention can be employed with other connectors. It may be seen that connecting arms 7 of blade contacts 6 are plugged and soldered into the circuit board 2. Schematically shown is a component 34 which may be an electro-optic transducer for instance. Blades 6 are held in known manner in an insulating part 11 of contact insert or housing 1.

FIGS. 2 and 3 illustrate blade hybrid contact insert 1. As the name implies, the hybrid contact insert contains a mixture of conventional contacts (blade contacts in the case illustrated) and special contacts, to form a hybrid connector. Accordingly, contact insert 1 contains a blade contact area 3 and special contact areas 4 and 5. Connecting arms 7 for two contact blades 6 are shown in FIG. 3. Holes 70 in the insulating part 11 are provided to seat the special contacts which may be connected to the circuit board in a suitable manner. FIG. 5 shows a special contact 83, inserted in its associated hole 70. Special contact 83 may interact with a special contact 84 provided in the associated spring contact insert 50 (see FIGS. 4 and 5), as will be described in greater detail with reference to FIG. 5.

FIG. 4 also shows that the contact spring not shown in spring strip 50 may be connected to a flat cable 80, whereas special contacts 84 (shown in FIG. 5 only) communicate with a connecting line 81, such as a light waveguide, via a connecting part 82 for each line.

FIG. 5 shows more clearly the attachment of contact insert 1 to circuit board 2, and it also illustrates (in dotted lines) the procedure which was followed in the past when using electro-optic transducers. If there were an electro-optic transducer 78 on the circuit board 2, the light waveguide schematically shown at 77 was provided heretofore which extended from electro-optic transducer 78 to have its end 52 terminate in a retaining part 75 disposed in contact insert 1.

Centrally located on the circumference of retaining part 75 is a slightly tapered spring ring 79. As viewed from the inside, hole 70 which accommodates retaining part 75 has hole sections 71, 72 and 73. Hole section 73 is of the largest diameter, hole section 72 has the smallest diameter and hole section 71 has an intermediate diameter. A bearing surface 74 is formed between hole sections 72 and 73, and a ring contact surface 10 facing in the opposite direction is formed between hole sections 71 and 72. To attain the condition shown in FIG. 5, in assembly special contact 83 is pushed so far into hole 70, from the left in FIG. 5, that spring ring 79 snaps in behind ring contact surface 10 and the larger diameter section 76 of retaining part 75 comes to lie adjacent to bearing surface 74.

Spring contact insert 50 seen on the right in FIG. 5 has in its insulating part 51 a hole 53 which corresponds to hole 70 and forms a ring bearing surface 54 against which can rest a spring ring 55 which forms part of special contact 84. Special contact 84 has a light waveguide end 52. When inserting contact insert 50 into contact insert 1 in the direction of arrow 57, the two light conductor ends 52, 52 are in mutual alignment. Special contact 84 also has a retaining ring 56 and the already mentioned connecting part 82.

The present invention provides an active special contact, i.e., a special contact in which an electronic active element is accommodated, preferably an electro-optic or opto-electronic transducer. Due to the fact that the transducer has been placed into the special contact, considerable advantages are brought about.

Figure 7:
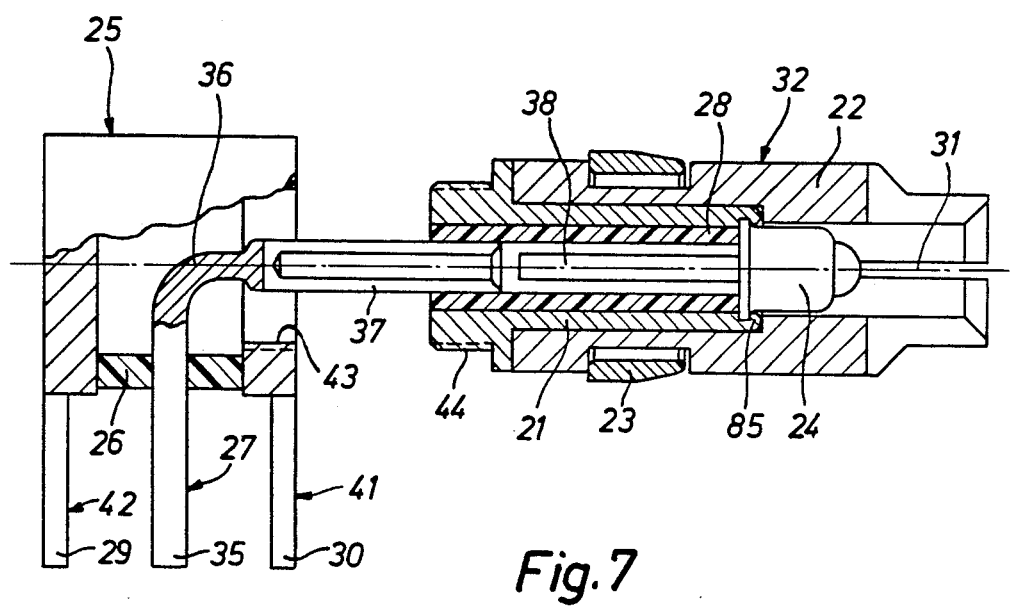
FIG. 7 is a section similar to that shown in FIG. 6, illustrating that a holding element to seat an electro-optic transducer can be removed from its associated housing.

One embodiment example of an active special contact 20 according to the invention is shown in FIGS. 6 and 7. Special contact 20 can be inserted into a hybrid contact insert as was described above for a known special contact with reference to FIG. 5. Special contact 20 according to the invention is preferably inserted into a blade contact insert. Special contact 50 shown on the right in FIG. 5 can then interact without problem with the special contact of FIG. 6.

Special contact 20, which could also be called a transducer seating device, basically comprises two components, namely a housing 25 and a supporting or holding element 32. Means for the detachable connection of housing 25 and holding element 32 are provided by a threaded connection. For this purpose, there are provided in a side wall of the housing 25 a hole with an internal thread 43 and on the holding element 32 an external thread 44 (see FIG. 7).

Housing 25 is designed in blockshape in the form of a cube and preferably is formed of metal. In a hole in the bottom wall of housing 25 is located an insulating washer 26 with a center bore through which the connecting arm 35 of a contact element 27 extends. In addition, housing 25 has two more contact elements 41 and 42 which terminates in connecting arms 29 and 30. Both contact elements 41 and 42 are thus connected to metal housing 25 and are generally grounded. Connecting arms 29, 30 and 35 may be soldered into the circuit board 2, similar to contact arms 7 of the blade contacts in FIG. 1, or attached using surface mount technology. The soldering operation is performed after active special contact 20 has been inserted in a hole 70 in insulating part 11, similar to what is shown in the left-hand side of FIG. 5 for special contact 83. FIG. 6 shows only the bearing surface 10 for spring ring 23 described below.

Holding element 32 is assembled of several parts. A metal sleeve 21 is equipped at one end with the external thread designated 44 (see FIG. 7). An insulating sleeve 28 is fastened to the inside diameter of the interior of sleeve 21. A transducer in the form of a diode 24 is fastened to the end of the metal sleeve 21 away from thread 44. Diode 24 is preferably fastened to metal sleeve 21 by a crimp 85 which grips a rim of diode 24. The housing of diode 24 forms the one diode terminal which thus communicates with connecting arms 29 and 30 via metal sleeve 21 and housing 25. The diode has another centrally located terminal in the form of a contact pin 38. This contact pin extends into the cavity formed by insulating sleeve 28. Contact element 27 has a curved portion 36 which starts at connecting arm 35 and ends in a connecting part 37. Connecting part 37 is designed in the form of a contact spring which extends through the center of the hole in the side wall of housing 25, its outside diameter fitting tightly into insulating sleeve 28. Contact spring 37 is slotted and accommodates contact pin 38 of diode 24 when holding element 32 is screwed into housing 25 along the longitudinal axis 31 of holding element 32. The result is a good contact, unaffected by rotary motion between contact spring 37 and contact pin 38 of diode 24, with insulating sleeve 28 at the same time insulating connecting part 37 from metal sleeve 21.

There is also press-fitted to metal sleeve 21 a plastic guide sleeve 22. Most of diode 24 is located in a hole 86 of guide sleeve 22. At its free end, guide sleeve 22 is tapered down and slotted to facilitate the seating of a special contact 84 in the manner shown in the right side of FIG. 5.

Guide sleeve 22 supports in an annular groove on its outside diameter a spring ring 23 which, as already mentioned, rests against a ring bearing surface 10 when introducing active special contact 20 into a hole 70.

If in the course of the operation of diode 24 (generally of a transducer) it turns out that it must be replaced, the invention makes it possible to exchange diode 24 easily. In the embodiment example shown this is done by unscrewing the entire holding element 32 from housing 25 and screwing a new holding element 32 with a new diode 24 back in again. Due to the contact design according to the invention this screwing in and out operation is possible without having to unsolder perhaps the entire active special contact from the circuit board.

It should also be noted that guide sleeve 22, press-fitted to the metal sleeve 21, ensures centering the light waveguide contact with respect to diode 24. Insulating sleeve 28 is preferably pressed into metal sleeve 21. Due to the fact that transducer 24 has a centrally and axially disposed contact element 38 there results a good contact, not broken by rotation of holding element 32, when the contact spring 37 is inserted in insulating sleeve 28.

The ability to replace transducer 24 without having to unsolder the contact insert is of great importance partcularly for opto-electronic transmitters because their life is limited and unsoldering the contact insert would be very costly.

Due to the fact that in the holding element according to this invention, which could also be called a diode seat, the central diode contact contact 38 is completely shielded up to the chassis by metal sleeve 21 and the metal block of housing 25, favorable conditions result, which is of particular importance for receivers. For the transmitter, on the other hand, the metallic connection is of importance for the dissipation of heat.

We claim:

1. An active special contact adapted for insertion into a hybrid contact insert of a connector, said active contact comprising a housing, first contact elements disposed in said housing, a supporting element for receiving an electro-optic transducer, second contact elements provided in said supporting element, means for releasably connecting said housing and said supporting element, means for releasably connecting the first and second contact elements, and means for snapping said active contact into a hole of said contact insert.

2. A special contact according to claim 1, characterized in that said means for releasably connecting said housing and said supporting element comprises threads provided on said housing and on said supporting element.

3. A special contact according to claim 2, characterized in that said means for releasably connecting said first and second contact elements is designed to permit said housing and said supporting element to be plugged into each other or screwed into each other.

4. A special contact according to claim 3, characterized in that said first contact elements comprise connecting arms extending out of said housing and connecting means for connection to said second contact elements in said supporting element.

5. A special contact according to claim 4, characterized in that the connecting arms are designed for connection to a circuit board.

6. A special contact according to claim 4, characterized in that said connecting arms extend through a bottom wall of said housing and said connecting means for connection to said second contact elements extends through a side wall offset substantially perpendicular to said bottom wall.

7. A special contact according to claim 6, characterized in that said housing is formed of metal and that at least one of the connecting arms is formed on said housing.

8. A special contact according to claim 6, characterized in that the connecting arm of at least one contact element extends out of said housing and, opposite to said connecting arm, said element has a connecting part insulated from said housing and which extends through a hole in the side wall of said housing.

9. A special contact according to claim 8, characterized in that the contact element is retained in an insulating washer and projects in a cantiliver manner from the hole in the side wall of the housing.

10. A special contact according to claim 9, characterized in that the connecting part is designed as contact spring.

11. A special contact according to claim 1, characterized in that said supporting element comprises a metal sleeve which can be fastened to said housing and supports said electro-optic transducer.

12. A special contact according to claim 11, characterized in that one end of the metal sleeve has an external thread for fastening to an internal thread of said housing and that said electro-optic transducer is held on the other end of said sleeve.

13. A special contact according to claim 12, characterized in that the end of said metal sleeve opposite to its threaded end is crimped around the housing of the electro-optic transducer to retain said transducer.

14. A special contact according to claim 11, characterized in that said electro-optic transducer includes a contact element which projects into the interior of the metal sleeve.

15. A special contact according to claim 11, characterized in that the metal sleeve forms one of the second contact elements and connects the electro-optic transducer to said housing.

16. A special contact according to claim 11, characterized in that the contact element of said electro-optic transducer comprises a spring contact pin located in a bore of the connecting part.

17. A special contact according to claim 16, characterized in that there is press-fitted to the metal sleeve a guide sleeve for centering a light waveguide contact with respect to the electro-optic transducer.

18. A special contact according to claim 17, characterized in that there is disposed on the guide sleeve a spring ring for retention of said contact in a chamber of the contact insert.

19. A special contact according to claim 1, characterized in that said transducer is disposed so that its connecting means in the form of a contact pin lies along the longitudinal axis of the contact and is connectable with a connecting part in the form of a spring also lying along the longitudinal axis, the housing of the transducer further forming second connecting means contacted by a metal part in the form of a metal sleeve of said supporting element in order to connect the second connecting means to at least one of the first contact elements in said housing when said supporting element is inserted into said housing.

* * * * *